United States Patent [19]
Le et al.

[11] Patent Number: 5,818,288
[45] Date of Patent: Oct. 6, 1998

[54] CHARGE PUMP CIRCUIT HAVING NON-UNIFORM STAGE CAPACITANCE FOR PROVIDING INCREASED RISE TIME AND REDUCED AREA

[75] Inventors: Binh Quang Le, Santa Clara; Pau-Ling Chen, Saratoga; Shane Hollmer, San Jose, all of Calif.

[73] Assignee: Advanced Micro Devices, Inc., Sunnyvale, Calif.

[21] Appl. No.: 672,095

[22] Filed: Jun. 27, 1996

[51] Int. Cl.$^6$ ...................................................... H02M 7/25
[52] U.S. Cl. .............................. 327/536; 363/59; 363/60; 307/110
[58] Field of Search ..................................... 327/157, 536, 327/337; 363/59, 60; 307/110

[56] References Cited

U.S. PATENT DOCUMENTS

| | | | |
|---|---|---|---|
| 4,186,436 | 1/1980 | Ishiwatari | 363/60 |
| 4,398,099 | 8/1983 | Benoit-Gonin et al. | 327/65 |
| 4,554,622 | 11/1985 | Mommsen et al. | 307/110 |
| 5,301,097 | 4/1994 | McDaniel | 363/60 |
| 5,568,035 | 10/1996 | Kato et al. | 363/59 |

FOREIGN PATENT DOCUMENTS

| | | |
|---|---|---|
| 84103794 | 4/1984 | China . |
| 84111711 | 11/1984 | China . |
| 03206457 | 7/1991 | Japan . |

*Primary Examiner*—Kenneth B. Wells
*Attorney, Agent, or Firm*—Fliesler, Dubb, Meyer & Lovejoy LLP

[57] ABSTRACT

A charge pump circuit having a fast rise time and reduced physical area is disclosed. The charge pump includes a plurality of stages having a non-uniform series of bootstrap capacitors. By using non-uniform capacitors at the various stages, charging rise time is enhanced while at the same time the overall physical size of the charge pump is reduced.

18 Claims, 6 Drawing Sheets

5,818,288

CHARGE PUMP CIRCUIT HAVING NON-UNIFORM STAGE CAPACITANCE FOR PROVIDING INCREASED RISE TIME AND REDUCED AREA

FIELD OF THE INVENTION

The present invention relates generally to charge pumps and, more particularly, to an improved charge pump circuit for use with semiconductor devices having enhanced rise time and reduced physical area.

BACKGROUND OF THE INVENTION

In semiconductor applications, a charge pump is used to increase a small input voltage (for example, Vcc) into the larger voltages that are passed to the word lines and bit lines of semiconductor memory devices. These voltages effect the reading and writing of data from/to the memory device. The voltage is increased by channeling the relatively small input voltage through a series of stages. The more stages a charge pump has, the greater the resulting output voltage.

Rise time, or charge pump-up time (the amount of time necessary to convert the input voltage, Vcc, to the required output voltage) directly affects the time needed to read information from and write information to a particular byte of memory. Currently, charge pumps are constructed using several bootstrap capacitors having the same size (capacitance) C at each respective node of the charge pump. A bootstrap capacitor is defined as the capacitor connected to each respective node of a charge pump. Thus, to reduce rise time, the capacitance at each successive node is increased until the application defined speed requirement is met.

With conventional charge pumps, by increasing the capacitance at each stage the time required to generate the necessary output voltage decreases. However, the rise time does not improve significantly with the increase of capacitance. The decrease in rise time reaches a limit that cannot be surpassed. Thus, with conventional charge pumps, there is a limit to the attainable rise time.

As the required voltages for applications increases, the number of stages necessary to generate the higher output voltages also increases. Another drawback associated with conventional charge pumps is that with the increased number of stages, all having a common capacitance, the physical area taken up by the charge pump also increases.

A further drawback associated with conventional charge pumps is that as the number of stages increases, the power required to drive the charge pumps also increases due to the increased number of capacitors present in the charge pump.

Still a further drawback associated with conventional pumps is that as you increase the number of capacitors in a charge pump, the efficiency of the charge pump decreases.

Thus, there is a need for a charge pump having reduced rise time while at the same time taking up less physical area on an integrated circuit chip.

SUMMARY OF THE INVENTION

The present invention solves the aforementioned and related drawbacks associated with conventional charge pumps. The present invention is directed to a novel charge pump circuit where each individual stage of the charge pump is characterized by having a non-uniform bootstrap capacitance value as compared with the other stages. By not having the same amount of capacitance present at each stage, the charge pump rise time is enhanced while at the same time requiring less physical area and less power than conventional charge pumps. These features are provided by a charge pump including input means for providing a signal; output means for delivering a modified signal and multiple stage means, connected between the input and output means which generate the modified signal. The multiple stage means also include a plurality of capacitance means, wherein each respective one of the capacitance means has a different, unique value.

An advantage of the present invention is the ability to enhance the rise time as compared to conventional charge pumps.

A feature of the present invention is that the charge pump according to the present invention requires less physical space than conventional charge pumps.

Another feature of the charge pump of the present invention is that it requires less power than conventional charge pumps.

Yet another feature of the charge pump of the present invention is that it is more efficient than conventional charge pumps.

BRIEF DESCRIPTION OF THE DRAWINGS

These and other advantages and features of the present invention will become apparent from the following description of the embodiments, taken in conjunction with the accompanying drawings, where like numbers represent like elements, in which.

DETAILED DESCRIPTION OF THE EMBODIMENTS

The present invention provides an improved charge pump circuit for use with semiconductor devices. The present invention comprises a charge pump circuit architecture wherein each stage of the charge pump includes a bootstrap capacitor having a non-uniform capacitance value. This is in contrast to conventional charge pumps having multiple stages, where the bootstrap capacitors have the same value.

Figure 1:
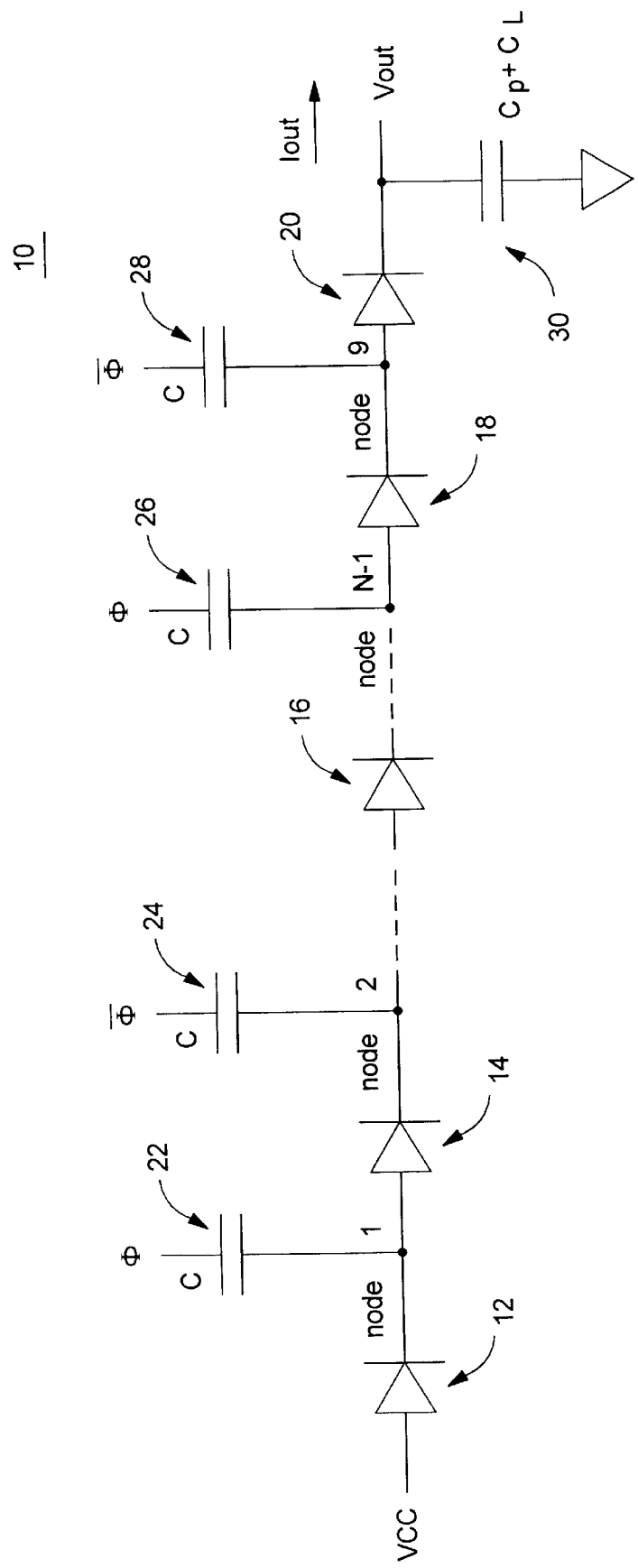
FIG. 1 illustrates a conventional charge pump architecture.

FIG. 1 provides an illustration of a conventional charge pump. As shown, the conventional charge pump 10 has a number of stages (stage 1 stage–N). The charge pump 10 has at its input, a voltage, Vcc which is transmitted through a diode 12 to a first node (node 1) including a first bootstrap capacitor 22 having a capacitance C. A second node (node 2) is connected to the first node (node 1) via diode 14 and also has a second bootstrap capacitor 24 having a capacitance C. The output of node 2 is then passed through a number of subsequent nodes, identical to previously described nodes 1 and 2, that also include a bootstrap capacitor having a capacitance value C that is identical to the capacitance value C present in nodes 1 and 2. Finally, the conventional charge pump has an output terminal, $V_{out}$, also having a capacitor 30 having a total capacitance $C_{out}$ which is defined as being the load capacitance ($C_L$) of the load connected to the output of the pump and a parasitic capacitance ($C_p$) inherent in the transmitting means of the conventional pump. As stated above, the bootstrap capacitance of the various nodes of the pump all have value C.

With conventional charge pumps, when the rise time needs to be enhanced, all that is necessary is to make the bootstrap capacitor at each respective node larger. However, there are drawbacks to the continual increasing of the capacitances at each node: rise time ceiling; increased power requirements and reduced efficiency.

The speed with which charge pumps operate is directly proportional to bootstrap coefficients, k's defined as:

$$\frac{C_i}{C_i + C_{i+1}} \quad (1)$$

where $C_i$ is the capacitance of the present node and $C_{i+1}$ is the capacitance of the next successive node. As discussed above, with conventional pumps, in order to decrease the charge pump up time you must increase the amount of capacitance at each successive node. However, when the capacitance at each successive node is increased, the only bootstrap coefficient value (k) that is increased is the bootstrap coefficient value of the last stage, $k_N$. The other bootstrap coefficients $k_1$–$k_{N-1}$ remain the same and are equal to 0.5 because all the capacitance values are equal as shown below:

$$\frac{C_i}{C_i + C_{i+1}} = 0.5 \quad (2)$$

Thus, for conventional charge pumps, the pump-up time can only be increased by a finite amount.

Figure 2:
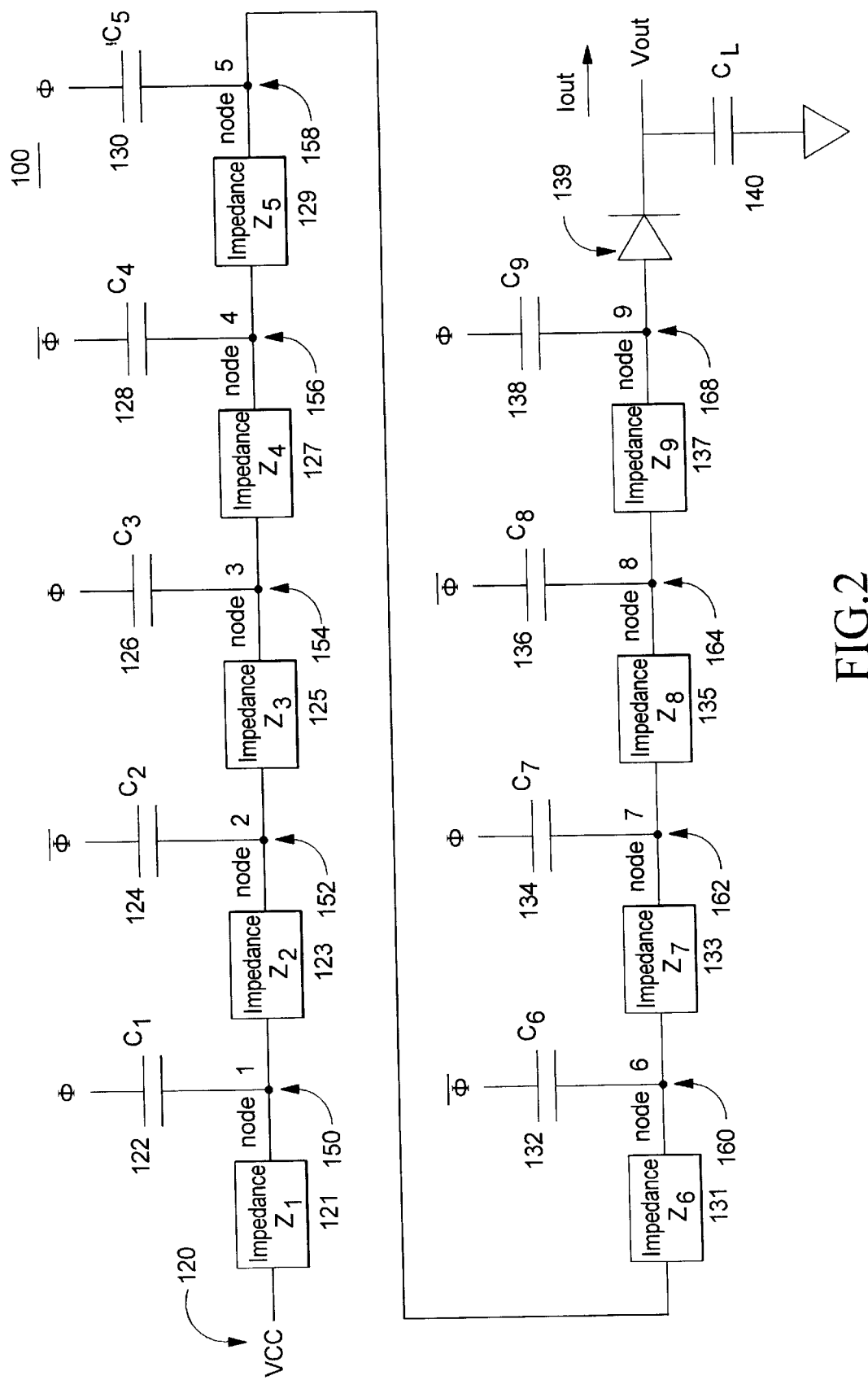
FIG. 2 illustrates a schematic diagram of the charge pump according to the present invention.

FIG. 2 illustrates one embodiment of the charge pump according to the present invention. The improved charge pump 100 has an architecture including an input 120 coupled to Vcc. The input 120 is coupled to a first stage, via impedance element 121 having impedance value $Z_1$, having a first node 150 including a capacitor 122 having a capacitance $C_1$.

The first stage is further connected to a second stage, via impedance element 123 having impedance value $Z_2$, including a second node 152 having a bootstrap capacitor 124 having a capacitance $C_2$, which is different from $C_1$. Coupled to stage 2 via impedance element 125 having impedance value $Z_3$ is stage 3 having a node 154 which includes a bootstrap capacitor 126 having a capacitance $C_3$. Coupled to stage 3 via impedance element 127 having impedance value $Z_4$ is stage 4 which includes a node 156 having a bootstrap capacitor 128 having a capacitance $C_4$. Stage 5, having a node 158 including a bootstrap capacitor 130 having a capacitance $C_5$, is connected to stage 4 via impedance element having impedance value $Z_3$ 129. Stage 6, which includes a node 160 having a bootstrap capacitor 132 having a capacitance $C_6$, is connected to stage 5 via impedance element 131 having impedance value $Z_6$. Next, stage 7 which includes a node 162 having a bootstrap capacitor 134 coupled thereto is connected to stage 6 via impedance element 133 having impedance value $Z_7$. The bootstrap capacitor 134 has a capacitance $C_7$ which is different in value than any of the preceding six capacitors.

Stage 7 is coupled, via impedance element 135 having impedance value $Z_8$, to stage 8. Stage 8 includes a node 164 having connected thereto a bootstrap capacitor 136 having a capacitance $C_8$. Stage 9 including a bootstrap capacitor 138 having a capacitance $C_9$, is connected to stage 8 via impedance element 137 having impedance value $Z_9$. Stage 9, the final stage of the charge pump according to the present invention, has a node 168, to which the bootstrap capacitor 138 is coupled to via impedance element 137 having impedance $Z_9$. The final stage (stage 9) is coupled through diode 139 to the output terminal of the charge pump $V_{out}$. The output terminal $V_{out}$ also has coupled thereto a load capacitor 140 denoted $C_L$. $C_L$ represents the total capacitance present at the output of the charge pump $V_{out}$. The capacitors used in the charge pump according to the present invention all have an oxide thickness in the range of about 150 Å–350 Å.

Also connected to each stage of the charge pump 100 are non-overlapping clocks $\Phi$ and $\overline{\Phi}$ which oscillate from 0 to Vcc.

In a first embodiment of the present invention, the charge pump shown in FIG. 2 contains nine stages and provides an output voltage of about 20 volts. Also, in the first embodiment of the present invention, the impedance elements 121, 123, 125, 127, 129, 131, 133, 135 and 137 are diodes. In a second embodiment of the present invention, the impedance elements are provided by diode connected MOSFETS that are operable to transfer a given current from one stage to another. In the first embodiment of the present invention, the stage bootstrap capacitors have the capacitance values as shown below in Table 1.

TABLE 1

| Node Capacitor | Size (pF) |
| --- | --- |
| $C_9$ | 28.3 |
| $C_8$ | 36.8 |
| $C_7$ | 47.8 |
| $C_6$ | 62.2 |
| $C_5$ | 80.8 |
| $C_4$ | 105.1 |
| $C_3$ | 136.6 |
| $C_2$ | 177.6 |
| $C_1$ | 230.9 |

For purposes of illustration, the bootstrap capacitors 122, 124, 126, 128, 130, 132, 134, 136 and 138 are represented as having capacitance values $C_1$–$C_9$, However, in practice, the bootstrap capacitor of a particular stage, n, has the value of the bootstrap capacitance present at node n plus the parasitic capacitance present at node n. For example, the total capacitance present at stage 2, $C_2$, comprises the bootstrap capacitance, denoted $C_{B2}$, present at node 2 plus the parasitic capacitance denoted $CP_{P2}$, also present at node 2. The capacitance present at the output $V_{out}$ is equivalent to the capacitance of the load connected to the output, $C_L$, plus the parasitic capacitance present at the output terminal, $C_P$.

Other values associated with the charge pump illustrated in FIG. 2 include the initial voltage to the pump $v_{init}$; the voltage swing at node N represented by:

$$V_{SW_n} = \frac{vcc \cdot C_{Bn}}{C_{Bn} + C_{pn}} \quad (3)$$

and the voltage drop through each impedance element, which is represented by $V_{pass}$. For the embodiment shown in FIG. 2, $v_{init}$ at every node is equal to Vcc, while $V_{pass}$=0.

For charge pumps, at a time t, each individual node is either charging a subsequent node or is being charged by a previous node. For purposes of illustration, assume V[n,t] is the voltage at node n at an arbitrary time t. Time, t, is measured at every T/2 clock cycle increments, where T is the period of the clock. Suppose an arbitrary node n (n is neither 0 nor 1) is charged at an arbitrary time t, then the voltage present at node n will increase by an amount $\Delta V_n$, represented by:

$$\Delta V_n = ((V[n-1,t-1] + Vsw_{n-}) - V[n,t-1]) \cdot k_{n-1} \quad (4)$$

where V[n−1,t−1] is the voltage present at the previous node at time t−1; $Vsw_{n-1}$ is the voltage swing of the previous node; and V[n,t−1] is the value of the present node voltage at a previous time t−1; and $k_{n-1}$ represents the bootstrap coefficient which is represented by:

$$\frac{C_{n-1}}{C_{n-1} + C_n} \quad (5)$$

where $C_{n-1}$ is the bootstrap capacitance of the previous node and $C_n$ is the bootstrap capacitance of the present node.

If node n is charging a subsequent node within the charge pump, then the node voltage will decrease by an amount of $\Delta V_n$ represented by:

$$\Delta V_n = ((V[n,t-1] + Vsw_n) - V[n+1, t-1]) \cdot (1 - k_n) \quad (6)$$

where V[n,t−1] is the value of the present node voltage at a time t−1; $Vsw_n$ is the voltage swing of the present node that is doing the charging; V[n+1,t−1] is the voltage present at the subsequent node at a time t−1; and $k_n$ is the bootstrap coefficient represented by:

$$\frac{C_n}{C_n + C_{n+1}} \quad (7)$$

where $C_n$ represents the bootstrap capacitance present at node n and $C_{n+1}$ represents the bootstrap capacitance of the subsequent node.

To have a fast rise time, $\Delta V_n$ should be large if the present node n is being charged, but should be small if node n is charging the next node. Both of these conditions are satisfied when the bootstrap coefficients k (0<k<1) are larger. For conventional pumps, the bootstrap coefficients, $k_1$–$k_{N-1}$, have a fixed value of 0.5 because the bootstrap capacitance of the present stage is equal to the bootstrap capacitance of both the previous and subsequent stages. This is not true for the bootstrap coefficient of the last node, $k_N$, due to the fact that the bootstrap capacitance $C_N$ of the last stage will be different from the load capacitance $C_L$ at the output, $C_N \neq C_L$.

The output voltage, $V_{out}$, is represented as shown below. Assume that V[0,t]=Vcc and V[1,t]=Vcc, with the change in voltage of the present node being represented by:

$$V_{cd}[n,t] = V[n,t-1] + ((V[n-1,t-1] + Vsw_{n-1}) - V[n,t-1]) \cdot k_{n-1} \quad (8)$$

when the node is charged by a previous node, and:

$$V_{cs}[n,t] = V[n,t-1] - ((V[n,t-1] + Vsw_n) - V[n+1, t-1]) \cdot (1 - k_n) \quad (9)$$

when the present stage n is charging a subsequent node. The output voltage of the charge pump is represented by:

$$V_{cd}[N+1, t] = V_{out}[t] + V_{out}[t-1] +$$

$$((V[N, t-1] + Vsw_N - V_t) - V_{out}[t-1]) \cdot k_n - \frac{I_{load}}{(2 \cdot f \cdot C_N)} \quad (10)$$

when the output is being charged by a previous node, and $$V_{ncd}[N+1, t] = V_{out}[t] = V_{out}[t-1] - \frac{I_{load}}{(2 \cdot f \cdot C_N)} \quad (11)$$

when the output is not being charged by the previous node. Thus, the voltage for any node can be determined by the equations shown above.

Figure 3:
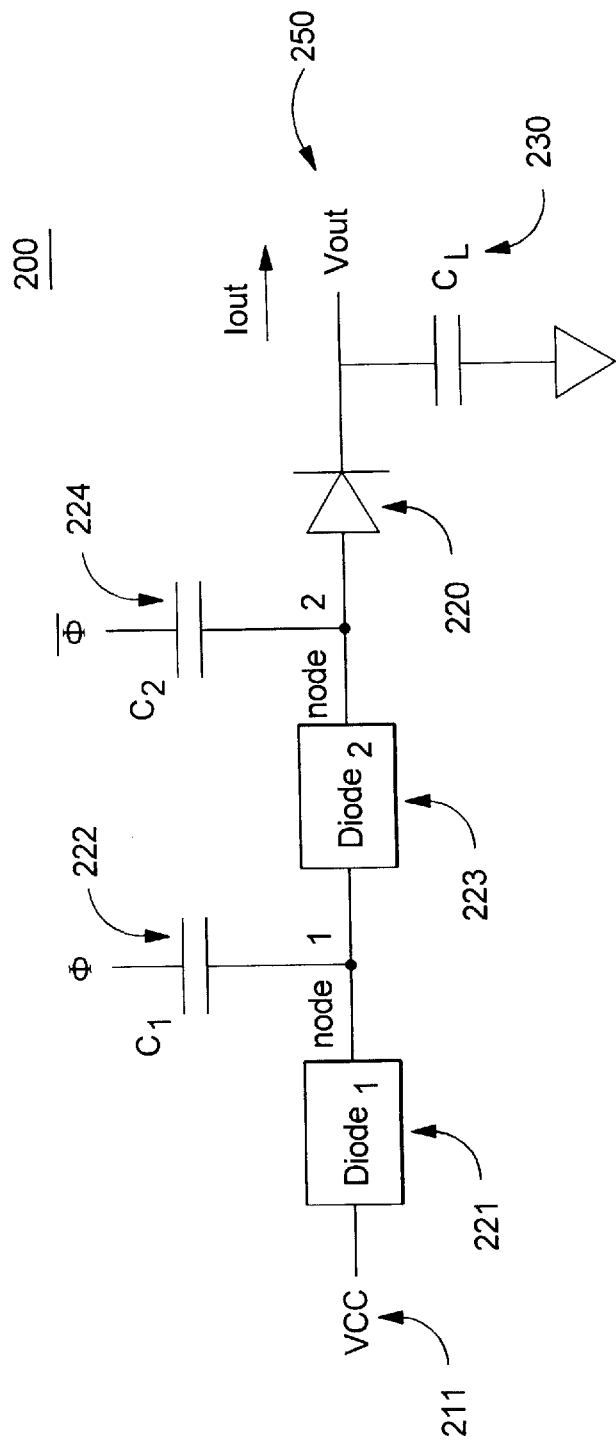
FIG. 3 illustrates a partial schematic diagram showing two stages of the charge pump according to the present invention.

The operation of the improved charge pump will now be described with reference to FIG. 3. FIG. 3 illustrates a two-stage charge pump 200 having the same operating characteristics as the nine stage charge pump 100 described with respect to FIG. 2. In operation, each node of the charge pump 200 is either being charged by a previous node or is charging a subsequent node.

Now, consider the two-stage charge pump 200 as depicted in FIG. 3. For purposes of illustration, assume that the voltage drop through the diode 220 is about 0. In this case, there are two bootstrap coefficients $k_1$ and $k_2$, where $k_1$ is represented by:

$$k_1 = \frac{C_1}{C_1 + C_2} \quad (12)$$

where $C_1$ is the bootstrap capacitance present at node 1 and $C_2$ is the bootstrap capacitance present at node 2, while $k_2$ is represented by:

$$k_2 = \frac{C_2}{C_2 + C_L} \quad (13)$$

where $C_2$ is the bootstrap capacitance present at node 2 and $C_L$ is the output load capacitance.

Suppose the voltage swing at node 1 and at node 2 is equal to Vcc and the initial voltages at node 1, node 2 and $V_{out}$ are 0. Vcc at the input 211 will pass through $\text{diode}_1$ 221, resulting in charging the capacitor 222 to Vcc. At this point, node 1 has the same voltage present at the input 211, Vcc. The current from node 1 is passed to node 2 via $\text{diode}_2$ 223. Thus, the voltage present at node 2, at the next half-cycle will be:

$$(V(1,0) + V_{cc}) \cdot K_1 = (\text{ti } V_{cc} + V_{cc}) \cdot k_1 = 2V_{cc} \cdot k_1; \quad (14)$$

$V_{out}$ at a half-cycle later will be:

$$(V[2,1] + V_{cc}) \cdot k_2 = 2V_2 \cdot k_1 + V_{cc} \cdot k_2 = 2V_{cc} \cdot k_1 \cdot k_2 + V_{cc} \cdot k_2 \quad (15)$$

The resulting current from node 2 ($I_{out}$) is passed through diode 220 to the output of the charge pump, thereby providing output voltage $V_{out}$.

For an N stage charge pump according to the present invention, the rise time can be represented by:

$$F_1(k_N) \cdot F_2(k_1, k_2, \ldots, k_{n-1}) \quad (16)$$

where $k_N$ is the bootstrap coefficient of the last node of the charge pump; $F_1(k_N)$ is an increasing function with respect to $k_N$ and $F_2(k_1, k_2, \ldots, k_{n-1})$ is an increasing function with respect to $k_1, k_2, \ldots, k_{n-1}$. As shown, the rise time of the charge pump is directly proportional to the stage bootstrap coefficients. For the charge pump according to the present invention, the bootstrap coefficient value k is equal to 0.574, representing a multiplication factor, m, of 1.35 where the multiplication factor (m) is equivalent to:

$$\frac{k}{1-k} \quad (17)$$

The multiplication factor indicates how much larger the previous stage bootstrap capacitor is, as compared to the current stage bootstrap capacitor.

Figure 4:
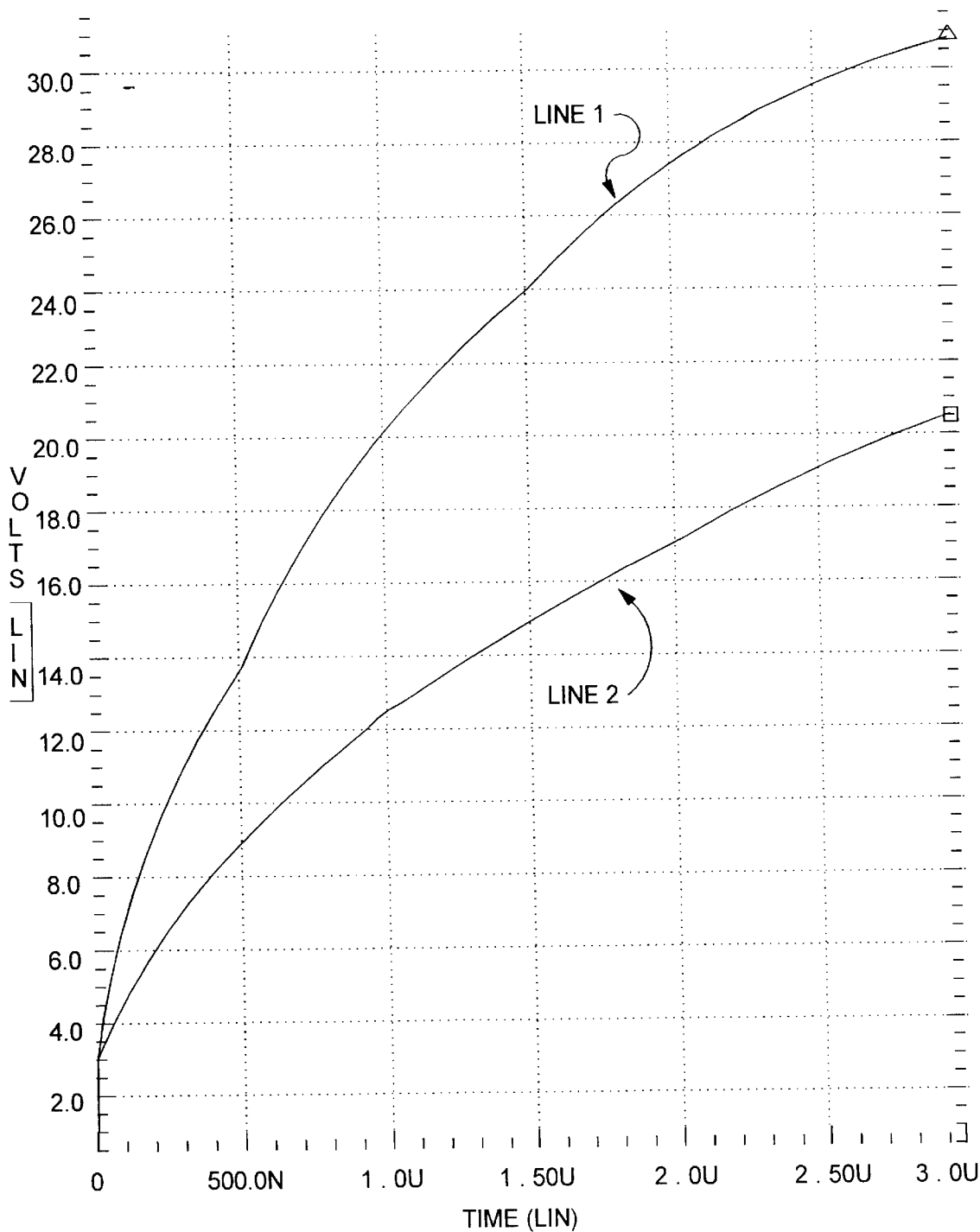
FIG. 4 is a graph representing charging time and speed characteristics between the charge pump according to the present invention and conventional charge pumps.

FIG. 4 represents a comparison between the rise time of the charge pump according to the present invention (represented by Line 1) and the rise time of the conventional pump (represented by Line 2). As shown in FIG. 4, after the same amount of charging time, the output voltage of the charge pump according to the present invention is 33% greater than that of the conventional pump.

Figure 5:
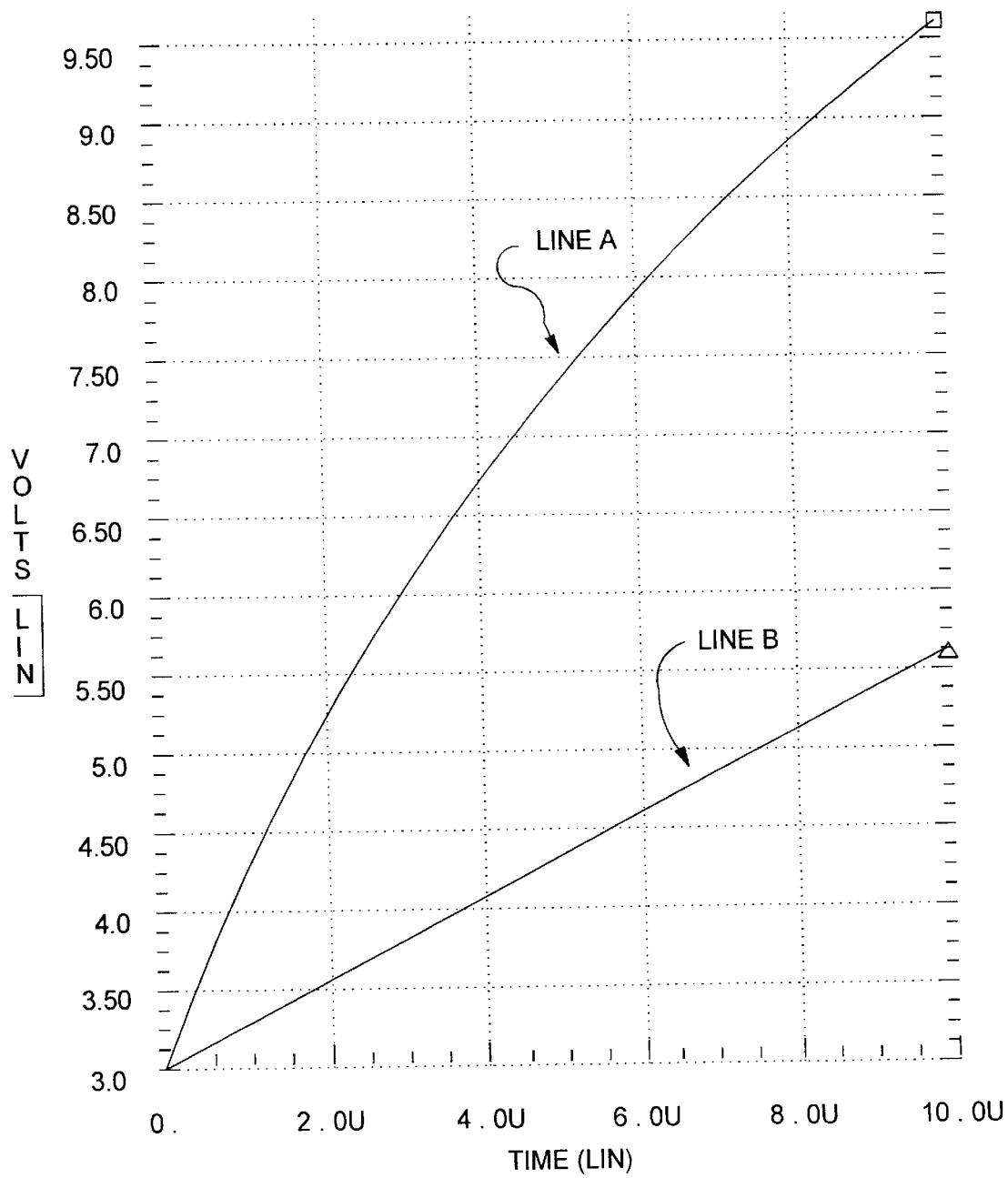
FIG. 5 is a graph representing voltage and speed characteristics between an eight stage charge pump according to the present invention and an eight stage conventional charge pump.

FIG. 5 represents a comparison of the charging characteristics of an eight stage charge pump according to the present invention (Line A) and the charging characteristics of a conventional pump also having eight stages (Line B) with both the conventional charge pump and the charge pump according to the present invention having the same last stage capacitor size. As shown in FIG. 5, after the same elapsed time, the output voltage generated by the charge pump according to the present invention (9.50) is 42% greater than that of the conventional pump (5.50) having the same number of stages.

Figure 6:
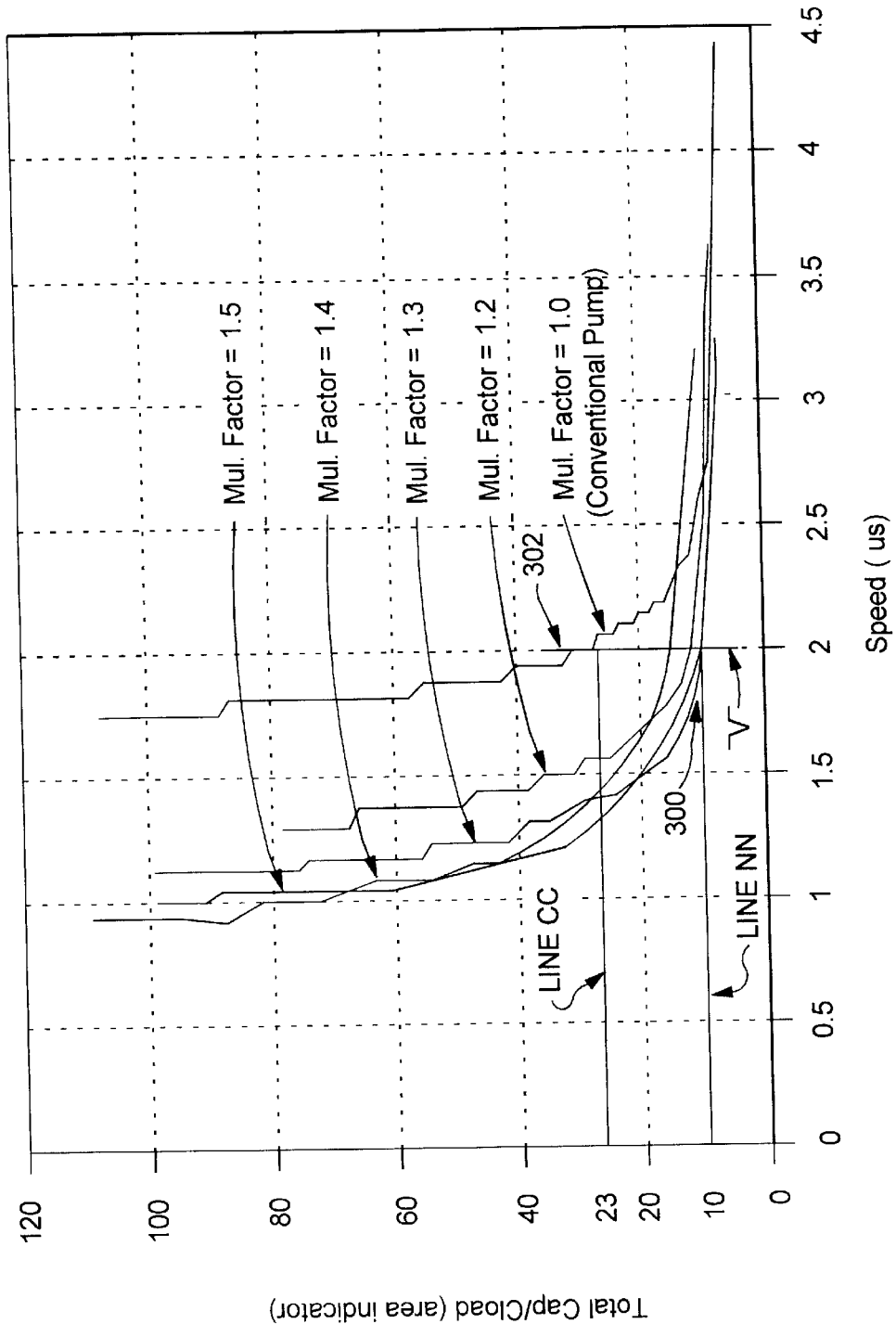
FIG. 6 is a graph representing physical area versus speed characteristics between the charge pump according to the present invention and a conventional charge pump.

FIG. 6 is a graph representing the rise time improvement of the charge pump according to the present invention over that of a conventional pump having the same area. For purposes of illustration, a load capacitance, $C_L$, of 100 pF is coupled to the output of the circuit presented in FIG. 2 and a load current, $I_{load}$, of 20 $\mu$A is assumed. The conventional pump is represented as having 13 stages. The charge pump of the present invention is represented as having nine stages. The number of stages was determined by the inventors to have the fastest rise time for a given output voltage of 20V. Note, the curves presented in FIG. 6 were generated by application of equations 3–10. As shown, the speed exhibited by the charge pump according to the present invention is much better than the speed of the conventional pump. For example, suppose an application requires a rise time of 1.5 $\mu$sec. The conventional charge pump cannot meet this speed requirement no matter how large the bootstrap capacitors are made because of the inherent limit of the bootstrap capacitances. Conventional charge pumps have a maximum limit of about 1.7 $\mu$sec, whereas rise times of about 1 $\mu$sec are available using the charge pump according to the present invention.

FIG. 6 also provides the means for determining the bootstrap coefficient, k, necessary to produce an optimized charge pump. The general rule is that the bootstrap coefficient, k, should be chosen according to the speed requirement. Thus, as depicted in FIG. 6, if the speed requirement is about 1.5 $\mu$sec, a multiplication factor of 1.2 or greater is satisfactory. If the speed requirement is between 1.25 $\mu$sec and 1.5 $\mu$sec, a multiplication factor of 1.3 or greater is satisfactory. And for a speed requirement of about 1 $\mu$sec and less, a multiplication factor of 1.5 or greater is required.

FIG. 6 is also used to determine the overall area of the resulting charge pump. The steps used to determine the total area required for the charge pump are as follows:

1. Determine the rise time necessary for the particular application. For the embodiments of the present invention, assume the rise time necessary is 2 $\mu$sec.

2. Next, draw a vertical line from the required rise time to the curve having the smallest area. This is represented in FIG. 6 by line V. Where the vertical line V and the curves intersect, 300, corresponds to the multiplication factor, m, used to determine the size of the capacitors for each stage of the charge pump of the present invention. As shown in FIG. 6, the multiplication factor required to meet the rise time of 2 $\mu$sec is 1.3.

3. Draw a horizontal line (Line NN) from the intersection point 300 to the vertical axis. This corresponds to the ratio of total capacitance to load capacitance of the charge pump. For the particular application contemplated, the ratio equals 10. Next, multiply that value by the user-defined load capacitance. The resulting value represents the total capacitance value of the charge pump.

4. Then, determine the area of the charge pump by dividing the total capacitance determined in step 3 by the conversion value:

$$\frac{2 fF}{\mu m^2}$$

resulting in the total area of the charge pump in units of $\mu m^2$. The conversion factor is dependent on the oxide thickness of the capacitors. The conversion value above is applicable when the bootstrap capacitors have an oxide thickness of about 150 Å. To convert the total area into mil$^2$, multiply the total area determined in step 4 by the conversion factor 1/645.

The same procedure can be used to determine the total capacitance needed for a conventional charge pump to meet the 2 $\mu$sec required rise time. As shown in FIG. 6, by drawing a horizontal line (Line CC) from the intersection of the rise time line of the conventional pump and the desired speed, 302, results in a ratio of total capacitance to load capacitance ratio of around 23. This, in turn, results in a total capacitance of about 2300 pF assuming a load capacitance of 100 pF. Thus, the total capacitance required for a conventional charge pump is about 2.3 times that required for the charge pump of the present invention.

This procedure can be used to determine the total area for a charge pump having any number of stages and required rise times. For the nine stage charge pump illustrated in FIG. 2, the total area required for a charge pump having a rise time of about 2 $\mu$sec and delivering an output voltage of 20V is about 775 mil$^2$. This is in contrast to the about 1,780 mil$^2$ that is required for the conventional pump to exhibit the same rise time. Thus, as shown above, to have a rise time of about 2 $\mu$sec, the conventional charge pump must be 2.3 times larger in size than the charge pump according to the present invention.

By determining the multiplication factor and the total capacitance required for a given application (time requirement), the size of the capacitors for each stage of the charge pump can be determined. The steps used to determine the individual capacitor sizes is as follows:

1. Determine the multiplication factor for the charge pump. (See step 2 above).

2. Determine the total capacitance required for the application. The total capacitance for the nine stage charge pump of the present invention is represented as:

$$C_{total} = m^8 C_N + m^7 C_N + m^6 C_N + \ldots + m C_N + C_N \qquad (18)$$
$$= C_N(m^8 + m^7 + m^6 + \ldots + m + 1)$$

where C total represents the total capacitance of the charge pump according to the present invention; CN represents the capacitance of the last stage; and m represents the multiplication factor determined above in step 1. (See step 3 above).

3. Determine the capacitance of the final stage of the charge pump by solving equation 18 above for $C_9$:

$$C_{total} = C_9 \frac{m^9}{m - 1} \qquad (19)$$

where $C_{total}$ represents the total capacitance of the charge pump according to the present invention, $C_9$ represents the bootstrap capacitance value of the final stage of the charge pump and m represents the multiplication factor determined in step 1.

4. After determining the size of the final stage capacitor in step 3, the size of each bootstrap capacitor is determined in reverse order, by multiplying the capacitance value of the capacitor of the previous stage by the multiplication factor.

Using the aforementioned method, the capacitors required for the nine stage charge pump of the present invention are presented above in Table 1.

The foregoing description of the embodiments has been presented for the purposes of illustration and description. It is not intended to be exhaustive or to limit the invention to the precise form disclosed. Modifications and variations of the invention are possible in light of the above teaching. A charge pump exhibiting enhanced rise time was chosen and described in order to best explain the principals of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A charge pump circuit, comprising:
   input means for receiving a signal;
   output means for providing a modified signal; and
   stage means, coupled between said input and output means, for generating said modified signal, said stage means including a plurality of capacitor means, wherein each respective one of said capacitor means has a different capacitance value and said capacitance value of each respective one of said capacitor means is based on a total capacitance of said charge pump circuit a load capacitance of said charge pump circuit, and a predetermined rise time.

2. The charge pump circuit of claim 1, wherein said stage means includes N number of stages, where N is an integer greater than 2.

3. The charge pump circuit of claim 1, wherein the stage means further includes an impedance means.

4. The charge pump circuit of claim 3, wherein said impedance means includes a diode.

5. The charge pump circuit of claim 3, wherein said impedance means includes a diode connected MOS transistor.

6. The charge pump circuit of claim 2, wherein the number of stages, N, equals 9.

7. A charge pump circuit architecture, comprising:
   an input terminal operative to receive an input signal;
   an output terminal operative to provide an output signal;
   a first stage including a first capacitor having a capacitance value $C_1$, said first stage coupled to said input terminal;
   a second stage including a second capacitor having a capacitance value $C_2$, said second stage coupled to said first stage, said second capacitance value $C_2$ being different from said first capacitance value $C_1$, and wherein capacitance value $C_2$ is approximately equal to capacitance value $C_1$ multiplied by 1/m, wherein m is a multiplication factor; and
   an output stage including a capacitor having a capacitance value $C_N$, said output stage coupled to said output terminal, wherein the output capacitance value $C_N$ is different from said second capacitance value $C_2$, and wherein capacitance value $C_N$ is approximately equal to capacitance value $C_2$ multiplied by 1/m, wherein m is the multiplication factor.

8. The charge pump circuit architecture of claim 7, further Including a diode coupled between said output stage and said output terminal.

9. The charge pump circuit architecture of claim 7, wherein said output capacitance value $C_N$ is different from said first capacitance value $C_1$.

10. The charge pump circuit architecture of claim 7, wherein said second capacitance value $C_2$ is less than said first capacitance value $C_1$.

11. A charge pump circuit, comprising:
    an input terminal operative to receive a signal;
    an output terminal operative to provide a modified signal; and
    a series of capacitive elements, coupled between said input terminal and said output terminal, operative to generate said modified signal, wherein a first capacitive element in said series has a larger capacitance value than a second capacitive element following the first capacitive element in the series, and a third capacitive element following the second capacitive element in the series has a smaller capacitance value than the second capacitive element, wherein the capacitance values are obtained by using a multiplication factor m.

12. The charge pump circuit of claim 11, wherein said first and second capacitive elements include a first and second capacitor, respectively.

13. The charge pump circuit of claim 11, wherein said series of capacitive elements include N capacitive elements, where N is an integer greater than 2.

14. The charge pump circuit of claim 13, wherein the number of capacitive elements N, equals 9.

15. The charge pump circuit of claim 11, further including a pass element coupled between the first and second capacitive elements.

16. The charge pump circuit of claim 15, wherein said pass element includes a diode.

17. The charge pump circuit of claim 15, wherein said pass element includes a diode connected MOS transistor.

18. A charge pump circuit, comprising:
    an input terminal operative to receive a signal;
    an output terminal operative to provide an output signal;
    a first stage including a first capacitor having a capacitance value $C_1$, said first stage coupled to said input terminal;
    a first diode coupled between said first stage and said input terminal;
    a second stage including a second capacitor having a capacitance value $C_2$, said second stage coupled to said first stage, said capacitance value $C_2$ is approximately equal to value $C_1$ multiplied by a 1/m value wherein m is a multiplication factor;
    a second diode coupled between said first stage and said second stage;
    a third stage including a third capacitor having a capacitance value $C_3$, said third stage coupled to said second stage, said capacitance value $C_3$ is approximately equal to value $C_2$ multiplied by said 1/m value;
    a third diode coupled between said second stage and said third stage;
    a fourth stage including a fourth capacitor having a capacitance value $C_4$, said fourth stage coupled to said third stage, said capacitance value $C_4$ is approximately equal to value $C_3$ multiplied by said 1/m value;
    a fourth diode coupled between said third stage and said fourth stage;
    a fifth stage including a fifth capacitor having a capacitance value $C_5$, said fifth stage coupled to said fourth stage, said capacitance value $C_5$ is approximately equal to value $C_4$ multiplied by said 1/m value;

a fifth diode coupled between said fourth stage and said fifth stage;

a sixth stage including a sixth capacitor having a capacitance value $C_6$, said sixth stage coupled to said fifth stage, said capacitance value $C_8$ is approximately equal to value $C_5$ multiplied by said $1/m$ value;

a sixth diode coupled between said fifth stage and said sixth stage;

a seventh stage including a seventh capacitor having a capacitance value $C_7$, said seventh stage coupled to said sixth stage, said capacitance value $C_7$ is approximately equal to value $C_6$ multiplied by said $1/m$ value;

a seventh diode coupled between said sixth stage and said seventh stage;

an eighth stage including an eighth capacitor having a capacitance value $C_8$, said eighth stage coupled to said seventh stage, said capacitance value $C_8$ is approximately equal to value $C_7$ multiplied by said $1/m$ value;

an eighth diode coupled between said seventh stage and said eighth stage:

a ninth stage including a ninth capacitor having a capacitance value $C_9$, said ninth stage coupled to said eighth stage, said capacitance value $C_9$ is approximately equal to value $C_8$ multiplied by said $1/m$ value;

a ninth diode coupled between said eighth stage and said ninth stage; and a tenth diode coupled between said ninth stage and said output terminal.

* * * * *

UNITED STATES PATENT AND TRADEMARK OFFICE
CERTIFICATE OF CORRECTION

PATENT NO. : 5,818,288
DATED : October 6, 1998
INVENTOR(S) : Binh Quang Le et al.

It is certified that error appears in the above-indentified patent and that said Letters Patent is hereby corrected as shown below:

Column 2, line 61, "(stage 1 stage-N)" should be -- (stage 1 - stage N) --;

Column 3, line 59, "element having impedance value $Z_3$ 129" should be -- element 129 having impedance value $Z_5$ --;

Column 4, line 53, "$CP_{P2}$" should be -- $C_{P2}$ --;

Column 5, line 9, "$\Delta V_n = ((V[n-1,t-1] + Vsw_n) - V[n,t-1]) \bullet k_{n-1}$" should be $\Delta V_n = ((V[n-1,t-1] + Vsw_{n-1}) - V[n,t-1]) \bullet k_{n-1}$ ;

Column 6, line 40 "$(V(1,0) + V_{cc}) \bullet K_1 = (ti\ V_{cc} + V_{cc}) \bullet k_1 = 2V_{cc} \bullet k_1$" should be $(V(1,0) + V_{cc}) \bullet k_1 = (V_{cc} + V_{cc}) \bullet k_1 = 2V_{cc} \bullet k_1$ ;

Column 6, line 52 "$F_1(k_N) \bullet F_2(k_1, k_2, \ldots, k_{n-1})$" should be $F_1(k_N) \bullet F_2(k_1, k_2, \ldots k_{n-1})$ ;

Column 9, line 30 after "pump circuit" insert a comma -- , --; and

Column 9, line 66 "Including" should be -- including --.

Signed and Sealed this

Twelfth Day of January, 1999

Attest:

Attesting Officer

Acting Commissioner of Patents and Trademarks